United States Patent [19]
Wisseman et al.

[11] 3,986,174
[45] Oct. 12, 1976

[54] COMMUNICATION SWITCHING SYSTEM

[75] Inventors: Leo L. Wisseman; Anthony G. Bryan, both of Scottsdale, Ariz.

[73] Assignee: Motorola, Inc., Chicago, Ill.

[22] Filed: May 2, 1974

[21] Appl. No.: 466,117

[52] U.S. Cl................ 340/173 R; 340/173 SP; 307/238
[51] Int. Cl.².................................. G11C 11/40
[58] Field of Search............. 340/173 R, 173 SP; 307/238, 279

[56] References Cited
UNITED STATES PATENTS

| | | |
|---|---|---|
| 3,678,475 | 7/1972 | Jordan.......................... 340/173 SP |
| 3,744,036 | 7/1973 | Frohman-Bentchkowsky 340/173 SP |
| 3,852,723 | 12/1974 | Wei-Wha Wu................. 340/173 R |

Primary Examiner—Terrell W. Fears
Attorney, Agent, or Firm—Harry M. Weiss; Kenneth R. Stevens

[57] ABSTRACT

An array of integrated circuits for selectively connecting a first communication line to a second communication line which employs a latching type semiconductor memory element for selectively energizing and de-energizing the semiconductor connect or disconnect switches located in the communication path. Addressing means are selectively responsive to addressing and reset signals for activating or deactivating the semiconductor latching circuit for either opening or closing the semiconductor switch. The semiconductor latching circuit is external to the communication lines and is capable of being set by the addressing signals and deactivated by a common line in conjunction with the set signals.

11 Claims, 3 Drawing Figures

3,986,174

COMMUNICATION SWITCHING SYSTEM

BACKGROUND OF THE INVENTION

1. FIELD OF INVENTION

This invention relates to integrated circuits and more particularly to integrated circuits for interconnecting a communication line to any one of a plurality of communication lines.

2. DISCUSSION OF THE PRIOR ART

In numerous communication systems, such as a telephone switching network, a transmission path is provided between a given pair of input lines and any number of output lines by selectively establishing cross point connections in a switching matrix.

It has been suggested to use latching type semiconductors, such as silicon controlled rectifiers or silicon controlled switches, as cross point devices to provide connections between input and output transmission lines or communication lines. Basically, a latching semiconductor is set to a low impedance or conducting state by the application of signals to its gate electrode. Once this device conducts the gate electrode control signal is no longer required and the device latches into a set or conductive state. Thus, once the semiconductor latch is set no additional signal is required to maintain the latched position.

Furthermore, a latching type of device is desirable in that it possesses in high impedance, low current characteristic when residing in a nonconducting state, and a low impedance high current characteristic when in a conducting state. The device, therefore, provides excellent isolation between its gate electrode and its input and output electrodes in order to avoid erroneous switching due to system transients. Moreover, these devices possess excellent transient characteristics for communication purposes and are capable of high frequency operation.

In one known prior art system, latching semiconductor devices are employed as cross point switches for directly interconnecting coordinately disposed communication lines. Essentially, logic circuitry connected to addressing means is employed to select and set the latching semiconductor device in order to interconnect a particular cross point. The connection is maintained by having the switch conduct a current greater than its holding current. However, this type of arrangement suffers from two major problems. Firstly, even though the selection operation of a particular latchable semiconductor device is relatively straight forward from a circuit and complexity standpoint, the disconnect implementation requires the actual switching of current sources internal to the communication system in order to reduce the current in the latchable semiconductor device below the required holding current. Naturally, this increased circuitry becomes magnified manyfold when employed in the environment of a cross point switching matrix. Secondly, the selection and disconnect is performed internal to the communication system and thus signal conditions on the communication lines have the potential of interrupting the cross point condition as the latching element is located directly in the transmission path.

SUMMARY OF THE INVENTION

It is therefore an object of the present invention to provide a semiconductor switching system for a communication line which does not require a latchable element in the transmission path which can be susceptible to erroneous switching due to transmission signals.

Another object of the present invention is to provide an integrated circuit switching system for a communication system necessitating minimum power requirements.

Another object of the present invention is to provide a switching matrix array for a communication system which is capable of accessing a cross point location for a connect mode and which similarly can be disconnected by employing the connect mode addressing signals and a common reset signal.

Another object of the present invention is to provide an integrated circuit monolithic switching system for coordinate locations which only requires a single transistor for the connect and disconnect functions.

Another object of the present invention is to provide an integrated circuit switching arrangement for a communication system which employs a reduced number of devices.

Another object of the present invention is to provide an array of monolithic integrated devices capable of high density implementation with minimal power requirements for interconnecting coordinately disposed communication lines.

In accordance with the aforementioned objects, the present invention provides integrated circuits for selectively connecting a first communication line means to a second communication line means by employing addressing circuitry which is capable of supplying connect and disconnect current to a latchable semiconductor device located external to the communication path for opening or closing an integrated circuit switch.

DESCRIPTION OF THE PREFERRED EMBODIMENTS

Figure 1:
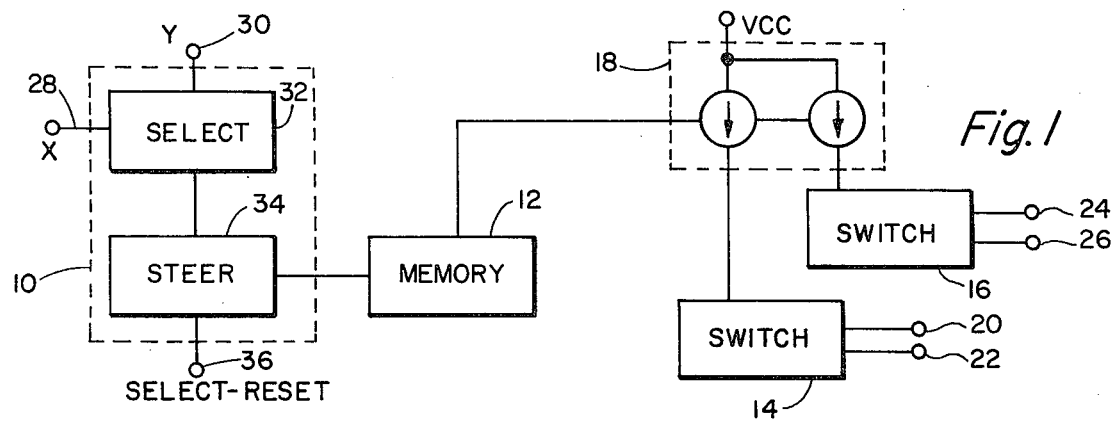
FIG. 1 is a block diagram illustrating the basic elements of the present invention.

Now referring to FIG. 1, it illustrates an overal block diagram of the present invention showing the manner in which addressing means 10 is capable of selecting a predetermined latachable semiconductor memory element 12 for connecting or disconnecting switching means 14 and 16, connected to current source 18, to communication lines (not shown), at terminals 20, 22, 24, and 26.

The addressing means 10 comprises coordinate select lines 28 and 30 for the X and Y direction, respectively, connected to a select means 32 which in turn is connected to a steering means 34. A select-reset common line 36 is connected to the addressing means 10. Upon the energization of select means 32, a predetermined current is supplied to latchable semiconductor memory element 12 for setting it to a conductive state. The memory element 12 is located external to the transmission path and is capable of selectively closing switch means 14 and 16 located in the transmission path (not shown in FIG. 1), for selectively interconnecting transmission lines connected to the output terminals 20, 22, 24 and 26. The current source 18 supplies the drive current for the switch means 14 and 16.

During reset the addressing means 10 is also capable of disconnecting or resetting the latchable semiconductor memory element 12 to its high impedance state by means of the coordinate addressing lines 28 and 30 in conjunction with the application of a reset signal to line 36. Significantly, this scheme allows a common reset line to be employed when the circuitry of FIG. 1 is implemented in a matrix arrangement thus providing increased densities, cost savings, and less complex circuitry.

Figure 2:
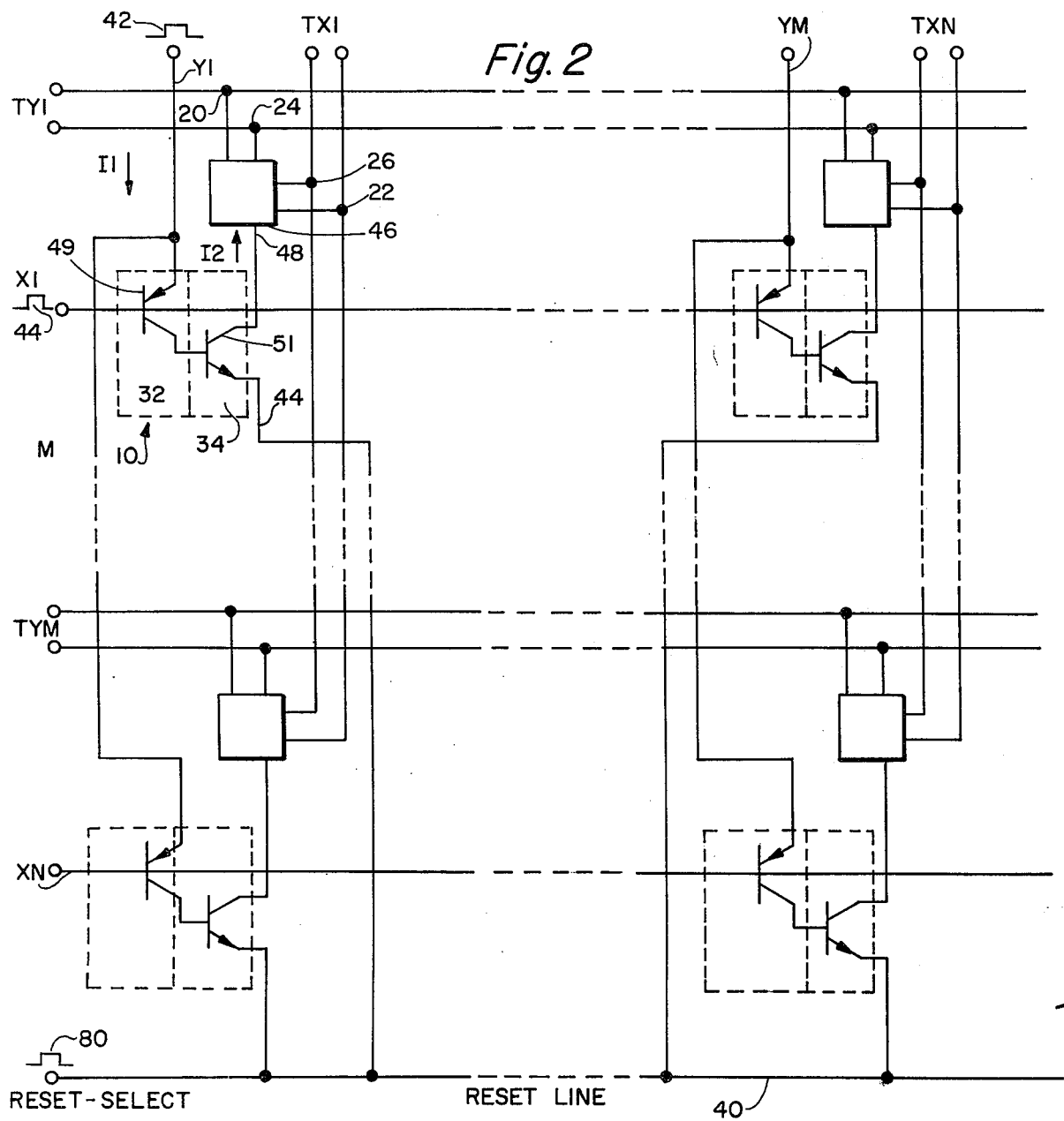
FIG. 2 is a more detailed schematic diagram illustrating the incorporation of the basic elements of the present invention in a general M by N coordinately disposed communication system array.

Now referring to FIG. 2, it illustrates the incorporation of the basic elements as described in FIG. 1 into an overall coordinate communication system constituting an N, in the Y direction by an M in the X direction, overall array.

The communication system in the preferred embodiment constitutes a plurality of X and Y coordinate pair of communication lines generally designated TXI ... TXM and TYI ... TYN. In the overall system the X addressing lines are designated XI ... XM ad the Y addressing lines are generally designated YI ... YN. A common reset line 40 provides reset signals to each of the coordinate array locations.

Figure 3:
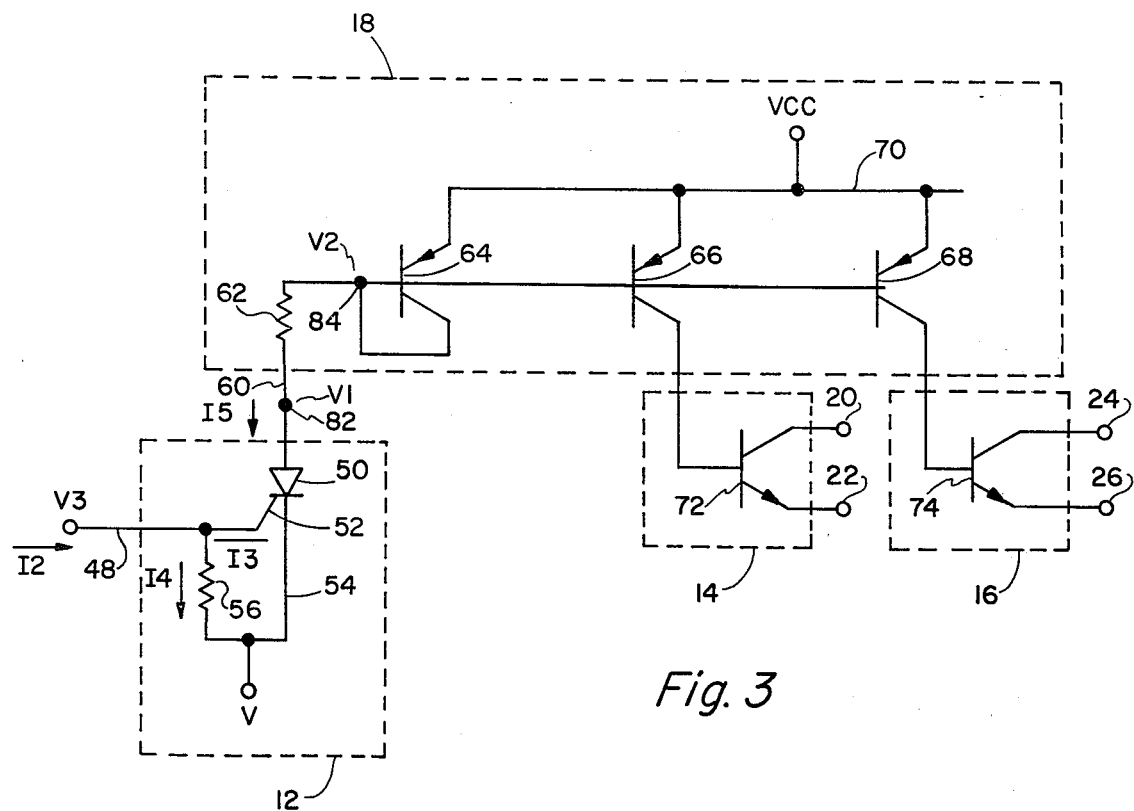
FIG. 3 is a detailed schematic diagram illustrating the details of the latchable semiconductor device and semiconductor switching elements shown generally in FIG. 2.

Like reference numerals are employed in FIGS. 1, 2, and 3, where possible, for designating like elements. The addressing means generally shown at 10 in FIG. 1 comprises a select portion 32 and a steer portion 34. As these elements are duplicated at each of the coordinate locations only the circuitry associated with a single coordinate location, namely the XI and YI cordinate location is described for purposes of simplicity and clarity. The addressing means 10 receives addressing signals on the XI and YI lines as represented by signals 44 and 42, respectively. Similarly, line 43, is connected to the common reset line 44 for receiving a reset signal when a memory element 12 is being employed in a disconnect mode of operation and thus being placed in a relatively high impedance state. Each of the coordinate locations further comprises a memory and switching section 46 which is hereafter shown in greater detail in FIG. 3. The memory and switching circuitry 46 is connected to the addressing means 10 via line 48.

In the preferred embodiment, the select means is constituted by a PNP transistor 49 having its base terminal connected to the YI line and its emitter terminal connected to the XI line. The steer section 34 is constituted by an NPN transistor 51 having its base terminal connected to the collector terminal of transistor 49, its emitter terminal connected to the line 43 for connection to the common reset line 44, and its collector terminal connected to line 48 for interconnection to the memory and switching section 46.

Each of the coordinate addressing lines YI ... YM and XI ... XN are capable of providing addressing signals to each of the coordinate locations in its associated column or row. The memory and switching means 46 provides two pairs of output terminals designated 20, 22, 24, and 26 in order to be consistent with the reference numerals employed in FIG. 1. In any event, terminals 20 and 22 interconnect the upper line of the TYI pair to the outer TXI line, and similarly, terminals 24 and 26 interconnect the lower TYI line to the inner TXI line.

Now referring to FIG. 3 for a detailed description of the memory and switching block 46. Again, like reference numerals are employed to designate like elements, where possible, the memory means 12 comprises a silicon controlled rectifier 50 (SCR) having its gate electrode 52 connected to line 48 which corresponds to the connection between the addressing means 10 and the memory and switching circuitry 46. The cathode of silicon controlled rectifier 50 is connected to a predetermined potential V by line 54 and its gate terminal is also connected to potential V by means of resistor 56.

The anode of SCR 50 is connected to the current source 18 by means of line 60 connected to resistor 62. The current source 18 comprises a PNP transistor 64 having its collector to base terminal short circuited in order to function as a diode, and a pair of PNP transistors 66 and 68, respectively, connected to the supply voltage by means of line 70. The pair of transistors 66 and 68 are connected to the switching elements 14 and 16 which comprise a pair of bipolar NPN transistors 72 and 74. The collector and emitter terminals of transistor 72 correspond to output terminals 20 and 22, and the collector and emitter terminals of transistor 74 correspond to terminals 24 and 26, as previously designated in FIGS. 1 and 2.

OPERATION OF THE INVENTION

For purposes of operational description, it is assumed that the circuitry associated with the XI – YI coordinate location is activated to perform a connect and disconnect function. During a connect operation XI and YI lines are selectively energized by applied input signals 41 and 42 so as to turn transistor 49 on. During the connect mode of operation, line 43 connected to the emitter of the steering transistor is at a relatively positive level or high impedance level and thus transistor 51 is nonconductive. This is represented by the select level associated with signal 80 being applied to common reset line 44. With transistor 49 in a conductive state, current depicted at I1 (FIG. 1) begins to flow. Even though transistor 51 is nonconductive, its base-to-collector terminals provides a diode path and thus current is delivered to the memory and switching circuit 46 as represented by current flow I2 in FIGS. 2 and 3. The current I2 splits into two current flows, the current I3 into the gate of SCR 50 and I4 into resistor 56. The value of currents I3 and I4 turn SCR 50 to a conductive state and the voltage at point 82, represented by V1 changes from the VCC potential to approximately one volt above the relatively negative supply V. Similarly, the voltage V2 at point 84 is now at approximately the VCC level. The value of resistor 62 can thus be selected to provide a current I5 which is approximately at the supply voltage or 5.0 volts in the preferred embodiment over or divided by the value of resistor 62. When SCR 50 is turned on to its low impedance state, the magnitude of the holding current is a function of the value of V3 over the value of resistor 56. With these conditions, transistors 72 and 74 are rendered conductive and their respective output terminals 20 – 22, 24 – 26 are inserted into the transmission path for interconnecting their associated transmission or communication lines.

In order to disconnect the communication or transmission lines, the X1 and Y1 lines are again energized by signals 40 and 42, respectively, but in this instance, coincidentally therewith the common reset line 40 is energized by a voltage represented by the reset level of signal 80. Initially, current I1 again begins to flow; however, in this instance the emitter of transistor 51 is biased by the reset level of signal 80 applied to the reset line 44 and thus transistor 51 functions in a conventional transistor manner and thus transistors 49 and 51 conduct with transistor 51 going into saturation. Accordingly, the voltage V3 on line 48 becomes approximately equal to the voltage at the cathode of SCR 50. This action turns SCR 50 to an off or to a high impedance state and thus it returns to its stable nonconducting condition with the value of I5 approaching zero. Accordingly, the circuitry of the present invention is capable of routing current into the memory element located external to the transmission path or away from the memory depending upon the condition of the reset line. The reset signal will have no effect on the memory condition unless both the X and Y lines have been selected. The current sources constituted by transistors 66 and 68 possess very high impedance and thus provide base current for the switching transistors 72 and 74 and will continue the flow as long as the memory element is in a conductive or low impedance state. Accordingly, the circuit implementation provides economical, reliable, monolithic integrated circuits for high performance switching matrices in a communication system.

While the invention has been particularly shown and described in reference to the preferred embodiments thereof, it will be understood by those skilled in the art that changes in form and details may be made therein without departing from the spirit and scope of the invention.

What is claimed is:

1. An integrated circuit for connecting at least one communication line means to another communication line means comprising:
   a. a first semiconductor switch means having a first impedance state corresponding to a disconnected mode and a second impedance state corresponding to a connect mode and constituting a transmission path between the at least one communication line means and the another communication line means;
   b. a current responsive semiconductor latching device means located external to the transmission path and coupled to said first semiconductor switch means and having a high impedance state for setting said first semiconductor switch means to said first impedance state at or below a first current level, and having a low impedance state for setting said first semiconductor switch means to said second impedance state at or above a second current level;
   c. addressing means located external to the transmission path and coupled to said current responsive semiconductor latching device means for selectively enabling said first semiconductor switch means by causing either said first or said second current level to be applied to said current responsive semiconductor latching device means;
   d. said addressing means further including a second semiconductor switch means connected to a pair of coordinate addressing lines and being responsive to applied coordinate signals for setting said semiconductor latching device means to its low impedance state;
   e. said addressing means further including reset line means adapted to receive a reset control signal and being coupled to said second semiconductor switch means;
   f. said second semiconductor switch means and said reset line means being responsive to the applied coordinate signals and the reset control signal for setting said current responsive semiconductor latching device means to its high impedance state;
   g. said current responsive semiconductor latching device means comprising a three terminal device, and said first semiconductor switch means comprising a three terminal device; and
   h. said reset line means including a third semiconductor switch means and an interconnected reset line, and being coupled to said semiconductor latching means and to said second semiconductor switch means for providing a conductive path from said second semiconductor switch means to said reset line in response to the application of coordinate and reset signals for setting said current responsive semiconductor latching device means to its high impedance state.

2. An integrated circuit for connecting at least one communication line means to another communication line means as in claim 1 wherein:
   a. said second and third semiconductor switch means comprise second and third complementary bipolar transistors, respectively;
   b. said second bipolar transistors having base and emitter terminals coupled to the addressing lines and its collector terminal coupled to said third bipolar transistor; and
   c. said current responsive semiconductor latching device means comprising a silicon-controlled rectifier, said third transistor having its emitter terminal coupled to said reset line and its collector terminal coupled to the gate terminal of said silicon-controlled rectifier.

3. An integrated circuit for connecting at least one communication line means to another communication line means as in claim 2 further including:
   a. means adapted for connection to a power supply and coupled to the anode terminal of said silicon-controlled rectifier and to said first semiconductor switch means for supplying current thereto.

4. An integrated circuit for connecting at least one communication line means to another communication line means as in claim 3 further including:
   a. biasing means connected to the cathode terminal of said silicon controlled rectifier.

5. An array of integrated circuits for selectively connecting a first communication line means to a second communication line means comprising:
   a. an M by N array of first semiconductor switch means;
   b. each of said first semiconductor switch means having a first impedance state corresponding to a disconnect mode and a second impedance state corresponding to a connect mode and constituting a transmission path between the first communication line means and the second communication line means;
   c. a plurality of current responsive semiconductor latching device means;
   d. each of said first semiconductor switch means located external to the transmission path and being coupled to an associated one of said current responsive semiconductor latching device means, each of said semiconductor latching device means having a high impedance state for setting its associated said first semiconductor switch means to said first impedance state at or below a first current level, and having a low impedance state for setting its associated said first semiconductor switch means to said second impedance state at or above a second current level;

e. coordinate addressing means located external to the transmission path and being coupled to said plurality of current responsive semiconductor latching device means for selectively enabling a predetermined one of said plurality of current responsive semiconductors latching device means by causing either said first or second current level to be applied to a predetermined one of said current responsive semiconductor latching device means;

f. said coordinate addressing means further including an array of second semiconductor switch means coupled to their associated coordinate addressing lines and being responsive to applied coordinate signals for setting a predetermined one of said semiconductor latching device means to its low impedance state;

g. said coordinate addressing means further including a common reset line means adapted to receive a reset control signal and being coupled to said plurality of said second semiconductor switch means, a predetermined one of said second semiconductor switch means being responsive to applied coordinate signals and a reset control signal for setting a predetermined one of said semiconductor latching device means to its high impedance state; and h. said reset line means further including a common reset line and an array of third semiconductor switch means, respective one of said third semiconductor switch means being coupled to respective ones of said semiconductor latching device means and to respective ones of said second semiconductor switch means for providing a conductive path from a predetermined one of said second semiconductor switch means to said reset line in response to the application of coordinate and reset signals for setting a predetermined one of said semiconductor latching device means to its high impedance state.

6. An array of integrated circuits for selectively connecting a first communication line means to a second communication line means as in claim 5 wherein:
said semiconductor latching device means each comprises a silicon-controlled rectifier and said first, second, and third semiconductor switch means comprise bipolar transistors.

7. An array of integrated circuits for selectively connecting a first communication line means to a second communication line means as in claim 6 further including:
a. means for supplying a current and being connected to said plurality of silicon controlled rectifiers and to said first semiconductor switch means.

8. In a communication system comprising:
a. an M by N coordinate array of communication line means;
b. an M by N array of integrated circuit first switch means and constituting a plurality of transmission paths for coupling any one of said M communication line means to any one of said N communication line means;
c. each of said first switch means having a first impedance state corresponding to a disconnect mode and a second impedance state corresponding to a connect mode for constituting one of said plurality of transmission paths for coupling said M communication line means to a predetermined one of said N communication line means;

d. an M by N array of current responsive semiconductor latching device means located external to the transmission path and each being coupled to an associated one of said M by N array of integrated circuit first switch means;

e. each of said current responsive semiconductor latching device means having a high impedance state for setting its associated said first switch means to said first impedance state at or below a first current level, and having a low impedance state for setting its associated said first switch means to said second impedance state at or above a second current level;

f. coordinate addressing means located external to the transmission path and coupled to said M by N array of current responsive semiconductor latching device means for selectively enabling one of said first switch means by causing either said first or second current level to be applied to one of said current responsive semiconductor latching device means;

g. said coordinate addressing means further including an array of second semiconductor switch means coupled to their associated coordinate addressing lines and being responsive to applied coordinate signals for setting a predetermined one of said semiconductor latching device means to its low impedance state and said coordinate addessing means including a common reset line means adapted to receive a reset control signal and being connected to said plurality of said second semiconductor switch means;

h. a predetermined one of said second semiconductor switch means being responsive to applied coordinate signals and a reset control signal for setting a predetermined one of said semiconductor latching device means to its high impedance state; and i. said reset means including a common reset line and an M by N array of third semiconductor switch means, respective ones of said third semiconductor switch means being coupled to respective ones of said semiconductor latching device means and to respective ones of said second semiconductor switch means and to respective ones of said second semiconductor switch means for providing a conductive path from a predetermined one of said second semiconductor switch means to said reset line in response to the application of coordinate and reset signals for setting a predetermined one of said semiconductor latching device means to its high impedance state.

9. In a communication system as in claim 8 wherein:
a. said semiconductor latching device means each comprise a silicon-controlled rectifier and said first, second, and third semiconductor switch means comprise bipolar transistors.

10. In a communication system as in claim 9 further including:
a. means for supplying a current and being connected to said plurality of silicon controlled rectifiers and to said plurality of first semiconductor switch means.

11. In a communication system as in claim 10 wherein:
a. said first semiconductor switch means comprise a pair of bipolar transistors for connecting any pair of said M communication line means to any pair of said N communication line means.

* * * * *